US012588349B2

(12) United States Patent
Chalkias et al.

(10) Patent No.: US 12,588,349 B2
(45) Date of Patent: Mar. 24, 2026

(54) ALL-PRINTED BIFACIAL CARBON-BASED PEROVSKITE SOLAR MODULE WITH TAILORABLE OPTOELECTRICAL CHARACTERISTICS MADE UNDER AMBIENT AIR

(71) Applicant: Brite Hellas SA, Salonika (GR)

(72) Inventors: Dimitris A. Chalkias, Patras (GR); Argyroula Mourtzikou, Ovrya Patras (GR); Elias Stathatos, Patras (GR); Nick Kanopoulos, Salonika (GR)

(73) Assignee: Brite Hellas SA, Salonika (GR)

( * ) Notice: Subject to any disclaimer, the term of this patent is extended or adjusted under 35 U.S.C. 154(b) by 0 days.

(21) Appl. No.: 18/647,120

(22) Filed: Apr. 26, 2024

(65) Prior Publication Data

US 2025/0338705 A1     Oct. 30, 2025

(51) Int. Cl.
| | |
|---|---|
| *H10K 39/18* | (2023.01) |
| *H10K 30/40* | (2023.01) |
| *H10K 30/50* | (2023.01) |
| *H10K 30/81* | (2023.01) |
| *H10K 30/88* | (2023.01) |

(52) U.S. Cl.
CPC ............. *H10K 39/18* (2023.02); *H10K 30/40* (2023.02); *H10K 30/50* (2023.02); *H10K 30/81* (2023.02); *H10K 30/88* (2023.02)

(58) Field of Classification Search
CPC ........ H01L 31/18; H10K 30/40; H10K 30/88; H10K 30/81
See application file for complete search history.

(56) References Cited

U.S. PATENT DOCUMENTS

| | | | |
|---|---|---|---|
| 2015/0249170 A1* | 9/2015 | Snaith | H10F 77/16 |
| | | | 136/265 |
| 2019/0279825 A1* | 9/2019 | van Hest | H10K 30/40 |
| 2021/0143350 A1* | 5/2021 | Irwin | H10K 30/40 |
| 2023/0167326 A1* | 6/2023 | Irwin | C09D 11/033 |
| | | | 106/31.92 |

FOREIGN PATENT DOCUMENTS

| | | | | |
|---|---|---|---|---|
| CN | 109671849 A | * | 4/2019 | B82Y 30/00 |
| CN | 114373811 A | * | 4/2022 | H01L 31/02167 |

OTHER PUBLICATIONS

English Machine Translation for CN 114373811A (Year: 2022).*
English Translation of CN 109671849A (Year: 2021).*

* cited by examiner

*Primary Examiner* — Kourtney R S Carlson
(74) *Attorney, Agent, or Firm* — CARTER, DELUCA & FARRELL LLP; George Likourezos

(57) ABSTRACT
A bifacial perovskite photovoltaic module includes two back-stacked independent all-printed carbon-based perovskite solar sub-modules and a sealant. The sub-modules include a plurality of solar stripes; a surface conductive substrate; an active layer; a hole-transport-layer; and a carbon electrode.

9 Claims, 9 Drawing Sheets

ALL-PRINTED BIFACIAL CARBON-BASED PEROVSKITE SOLAR MODULE WITH TAILORABLE OPTOELECTRICAL CHARACTERISTICS MADE UNDER AMBIENT AIR

TECHNICAL FIELD

This disclosure relates to all-printed bifacial solar modules with tailorable optoelectrical characteristics comprising metal halide perovskites as active layers and carbonaceous-based counter electrodes.

STATEMENT REGARDING GOVERNMENT SUPPORT

Aspects of the invention described herein are the result of development through the Operational Programme "Business Innovation Greece" $3^{rd}$ Calls for Proposals under the Innovation Norway Grants.

BACKGROUND

Perovskite solar cells (PSCs) are nowadays considered the most exciting and blooming solar cell technology ever developed, and the main up-and-coming potential substitute for the mature crystalline-silicon (c-Si) solar cells that now dominate the photovoltaics (PVs) market. The unique opto-electrical attributes that can be obtained by perovskite materials using simple and low-cost manufacturing have gained the interest of both global research and industrial communities. This propelled great progress in the field and had a tangible impact on the way that sustainable energy can be produced. Today, competitive efficiencies compared to the mature c-Si PVs have already been achieved by perovskite PV technology, with the topics of increasing the devices stability, decreasing the manufacturing cost, as well as decreasing the environmental footprint and increasing the application range of these devices, to be at the center of the research.

Taking into account that the golden triangle of solar cell development is bonded with cost, efficiency and lifetime parameters, the stability of PSCs is the "Achilles' heel" of this technology, which hinders its widespread commercialization. In the early years of the last decade, the lifetime of the PSCs was found to be on the order of minutes. Today, under the continuous efforts made to improve their stability, years-stable devices have been attained, with the carbon-based (C-based) PSC architecture being the main actor of this run. This stems from the properties of carbonaceous materials, which are characterized as inherently stable, inert to ion migration and water-resistant, protecting the sensitive perovskite active layer from degradation. Besides this, C-based architecture is considered the frontrunner to the PV market because of its ultra-low-cost manufacturing due to the employment of inexpensive carbon materials and full compatibility with printing techniques. Nevertheless, it is the power conversion efficiency (PCE) disparity between the C-based PSCs and commonly developed noble-metal-based PSCs that decreases the competitiveness of the former type of devices compared to the latter ones.

In the field of PVs, increasing the power output per unit area is constantly considered a great challenge to accomplish, with tandem solar cell structures to be the focus of research and development nowadays. In this direction, perovskite-based tandem solar cells, such as perovskite-silicon, perovskite-perovskite and perovskite-organic devices, have seized paramount attention of the PV community. However, it is the complicated design and increased manufacturing cost for their upscaling that push the development of alternative strategies for attaining more economic products to offer increased PCE. As an alternative, bifacial PV technologies have appeared since the 1980s. The concept of bifaciality continued after that, with cost-effective solutions being proposed and used for several niche applications from the 2000s. The technology flourished after 2009, mostly when big PV enterprises began to commercialize bifacial solar modules based on c-Si material. Bifacial PVs are nowadays perceived to be amongst the most important technologies for light-to-electricity conversion, due to the increased energy yield and lower Levelized Cost of Electricity (LCOE) that they can offer compared to their mono-facial counterparts. The International Technology Roadmap for Photovoltaic (ITRPV) predicts a great upward trend for bifacial PVs in the global market in the next decade. Nonetheless, they are still several challenges that delay their widespread adoption.

SUMMARY

In an aspect of the present disclosure, a method of manufacturing a bifacial perovskite photovoltaic module is presented. The method includes applying a sealant from one edge of a substrate to a second edge of the substrate of a rear-face solar sub-module of two sub-modules of a bifacial perovskite photovoltaic module and combining the two back-stacked independent all-printed carbon-based perovskite solar sub-modules.

In another aspect of the present disclosure, the photovoltaic manufacturing may be carried out under ambient atmospheric conditions.

In yet another aspect of the present disclosure, the sub-modules may include a plurality of solar stripes.

In yet another aspect of the present disclosure, a solar cell design of each sub-module is the same or different.

In a further aspect of the present disclosure, a surface conductive substrate of each sub-module may include at least one of fluorine-doped tin oxide coated glass, indium tin oxide coated glass, indium tin oxide coated polyethylene naphthalate, or indium tin oxide coated polyethylene terephthalate.

In yet another aspect of the present disclosure, the method may further include inkjet-printing an ink containing at least one of titanium oxide, tin oxide and zinc oxide to form an electron-transport-layer of each sub-module.

In a further aspect of the present disclosure, the method may further include selecting an electron-transport-layer of each sub-module between mesoporous or planar when developing sub-modules for high-intensity direct sunlight or low-intensity diffuse and indoor light operation, respectively.

In a further aspect of the present disclosure, the method may further include inkjet-printing of metal halide perovskites of $Cs_xMA_yFA_{1-x-y}Pb(I_{1-z-t}Br_zCl_t)_3$ structure to form an active layer of each sub-module.

In yet another aspect of the present disclosure, an active layer of each sub-module may include inkjet-printing an ink composed of perovskite precursors dissolved in at least one of dimethylformamide, dimethylsulfoxide, gamma-valero-lactone, or 2-methoxyethanol.

In a further aspect of the present disclosure, the method may further include forming $Cs_xMA_yFA_{1-x-y}Pb(I_{1-z-t}Br_zCl_t)_3$ structures by inkjet printing a perovskite precursor ink at a temperature between 50° C. and 100° C.

In yet another aspect of the present disclosure, the manufacturing of perovskite active layer may not include extra annealing processing after its printing for completing its crystallization.

In a further aspect of the present disclosure, the method may further include inkjet-printing an ink containing at least one metal oxide material to form a hole-transport-layer of each sub-module.

In yet another aspect of the present disclosure, a hole-transport-layer-free architecture may be applied for a front-face sub-module of the two back-stacked independent all-printed carbon-based perovskite solar sub-modules and a hole-transport-layer-based architecture is applied for a rear-face sub-module of the two back-stacked independent all-printed carbon-based perovskite solar sub-modules.

In a further aspect of the present disclosure, a carbon electrode of each sub-module may include blade coating or screen printing a paste containing at least one of graphite, carbon black, graphene, carbon nanotubes, or carbon nanowires.

In a further aspect of the present disclosure, the sealant may be at least one thermoplastic and thermoset polymer.

In yet another aspect of the present disclosure, the method may further include encapsulating the module under the conditions of >1 bar pressure and >100° C. temperature.

In an aspect of the present disclosure, a bifacial perovskite photovoltaic module includes two back-stacked independent all-printed carbon-based perovskite solar sub-modules and a sealant. The sub-modules include a plurality of solar stripes; a surface conductive substrate; an active layer; a hole-transport-layer; and a carbon electrode.

In yet another aspect of the present disclosure, the sealant may be at least one thermoplastic and thermoset polymer.

In a further aspect of the present disclosure, the encapsulation of the module may be carried out under >1 bar pressure and >100° C. temperature.

Other aspects, features, and advantages will be apparent from the description, the drawings, and the claims that follow.

BRIEF DESCRIPTION OF DRAWINGS

The accompanying drawings, which are incorporated in and constitute a part of this specification, illustrate aspects of the disclosure and, together with a general description of the disclosure given above and the detailed description given below, explain the principles of this disclosure, wherein.

DETAILED DESCRIPTION

This disclosure relates to all-printed bifacial solar modules with tailorable optoelectrical characteristics comprising metal halide perovskites as active layers and carbonaceous-based counter electrodes.

Figure 1:
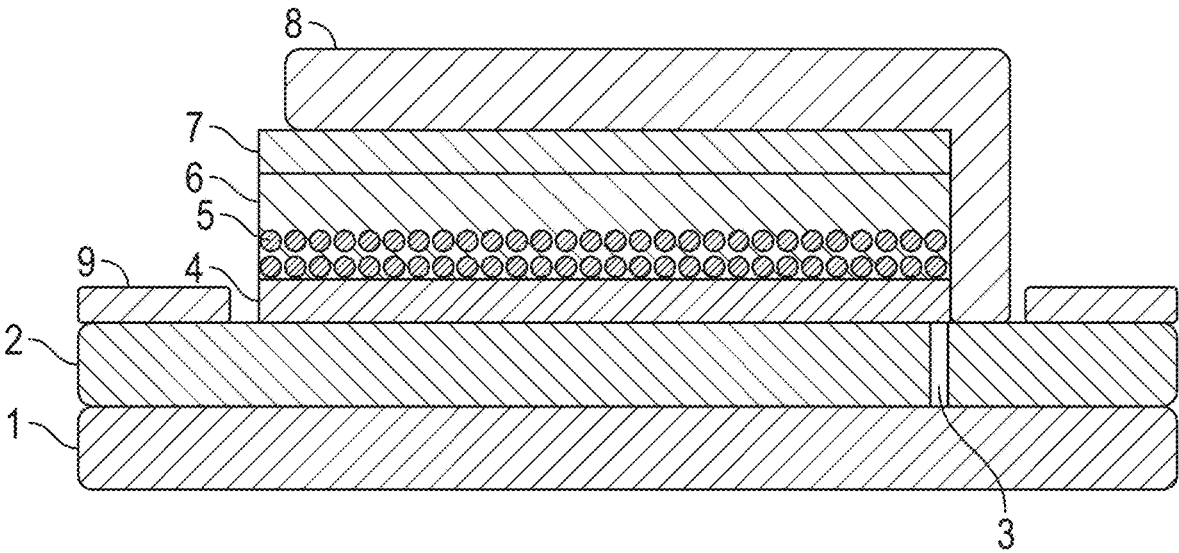
FIG. 1 is a cross-sectional schematic view of one perovskite solar stripe, in accordance with the principles of this disclosure.

The present disclosure is related to all-printed C-based bifacial perovskite solar modules with tailorable in-module transparency and power output. Bi-faciality is attained by the back-stacking integration of two independent C-based perovskite solar sub-modules fabricated entirely under ambient atmospheric conditions, using exclusively printing processing. The design of each of the sub-modules is optimized separately to attain high performance for either direct or diffuse light conditions, depending on the intended application. FIG. 1 presents the basic PSC configuration (one solar stripe) that is employed to develop the solar sub-modules. Each PSC is developed according to the structure: transparent conductive oxide (TCO)-coated substrate/electron transport layer (ETL)/perovskite active material/hole transport layer (HTL)/carbon electrode. More specifically, this architecture consists of three to five printed solar cell materials onto a TCO substrate. The majority of solar cell materials are prepared using different ink formulations for inkjet-printing, while the prepared carbon pastes are applied using blade-coating with needle scribing. Briefly, the PV manufacturing is carried out as follows. A compact ETL, such as titanium dioxide ($TiO_2$) or tin dioxide ($SnO_2$), is inkjet-printed onto the conductive side of the substrate, while, on the top of this layer, a mesoporous layer of the same materials is deposited (optionally) by the same method. Then, a thin film made of metal halide perovskites of ABX3 structure is inkjet-printed, wherein A and B are cations of different sizes and X is an anion. The term "metal halide perovskite," as used herein, refers to a perovskite, the formula of which contains at least one metal cation and at least one halide anion. On the top of this layer, an HTL, such as an inorganic p-type semiconductor (NiO, CuO and $Cu_2O$), is deposited (optionally) again by inkjet-printing. Finally, a μm-thick film of conductive carbonaceous materials is blade-coated on the top of the aforementioned solar cell materials. The carbonaceous materials can be but not limited to graphite, carbon black, graphene, carbon nanotubes or a mixture of them.

The individual layers of the PSC are described hereafter:

The substrate 1, according to an embodiment of the present disclosure, requires a sufficient level of rigidity to host the rest of the layers. Some examples of materials that can be used as substrate 1 may include but are not limited to transparent glass pane or plastic sheet. The thickness of substrate 1 varies between 0.125 and 4 mm but is not limited to this range.

The conductive layer 2, according to an embodiment of the present disclosure, which has the role of charges collection from the solar cell, is provided on the top of substrate 1. Some examples of compounds that can be used as conductive layer 2 but are not limited to are fluorine-doped tin oxide (FTO), indium tin oxide (ITO) and aluminum-doped zinc oxide (AZO). The thickness of the as-described layer 2 can vary between 500 to 800 nm but is not limited to this range. Besides, at the limits of materials deposition, the conductive layer 2 is laser scribed to isolate subsequently the negative electrode from the positive electrode (3).

The conductive layer 2, according to an embodiment of the present disclosure, is supplemented with an inkjet-printed compact ETL (4). The ETL 4 is preferable but not limited to a transition metal oxide, such as $TiO_2$, $SnO_2$ or ZnO. The selection of the previous metal oxides does not necessarily mean the use of one of them in the construction of the solar cell but also the combination of them. Layer 4, which is inkjet-printed on the top of material 2 may have a thickness ranging from 100 to 400 nm. A specific example of one metal oxide ink, but not limited to, is the following: a solution of titanium (di-isopropoxide) bis(2,4-pentanedionate) 75% in 2-propanol diluted (1/9 v/v) in a mixture of terpineol and acetonitrile (2:1 v/v). This ink is inkjet-printed to form a compact $TiO_2$ layer on the top of the material 2. The aim of using this coating is to develop a no-porous structure on the top of material 2, avoiding electrons recombination at the conductive substrate and ETL interface. According to an embodiment of the present disclosure, the metal oxide film is deposited and then thermally treated at 500° C. for 10 min to stabilize the metal oxide film 4 on top of material 2. The above procedure is repeated until the required thickness of metal oxide is succeeded. An example of the total number of metal oxide coatings, but not limited to, is about 5 to 7 repetitions with intermediate annealing time periods of about 10 to about 15 min at 500° C.

The conductive substrate 2 supplemented with inkjet-printed layer 4, according to an embodiment of the present disclosure, may be completed with inkjet printing of a mesoporous layer of metal oxide 5 (optional). The electron transport layer 5 is preferable but not limited to a transition metal oxide, such as $TiO_2$, $SnO_2$ or a combination of them. The layer 5 that is printed on top of layer 4 may have a thickness ranging from 600 to 1000 nm, but is not limited to this range, and holds a porous structure with particles specific surface area in the range of 50-120 $m^2$/g. The ink of mesoporous oxide can be made from a commercial product or prepared using sol-gel technology. A specific example of one metal oxide ink for the fabrication of the mesoporous layer, but not limited to, is the following: a commercially available $TiO_2$ powder (P25 Degussa) is treated with acetic acid (1 g of powder is mixed with 2 ml of ethanol and 0.2 ml acetic acid) under about 80° C. calcination for about 12 hours in a closed vessel, following by their drying at about 60° C. for about 6 hours; this powder is dispersed at first in 2 ml of water, adding consecutively 2 ml of ethylene glycol monopropyl ether and 2 ml of ethylene glycol monopropyl ether (0.1 wt % HCl); this paste is further diluted (1:3 v:v) in ethylene glycol monopropyl ether to facilitate its inkjet-printing. The particles "fire-agglomerate" on layer 4 at about 550° C. for about 1 hour to gain electrical contact and form an extensive three-dimensional network with interconnected pores. This mesoporous film has a complex morphology, a high roughness factor and a very high specific surface area. As the thickness of each mesoporous $TiO_2$ inkjet printing deposition pass for layer 5 is varied between about 100 nm and about 300 nm, the procedure of layer deposition and heating process may need to be repeated about 2 to about 5 times for the purpose of having the optimum thickness of the layer.

Figure 2A:
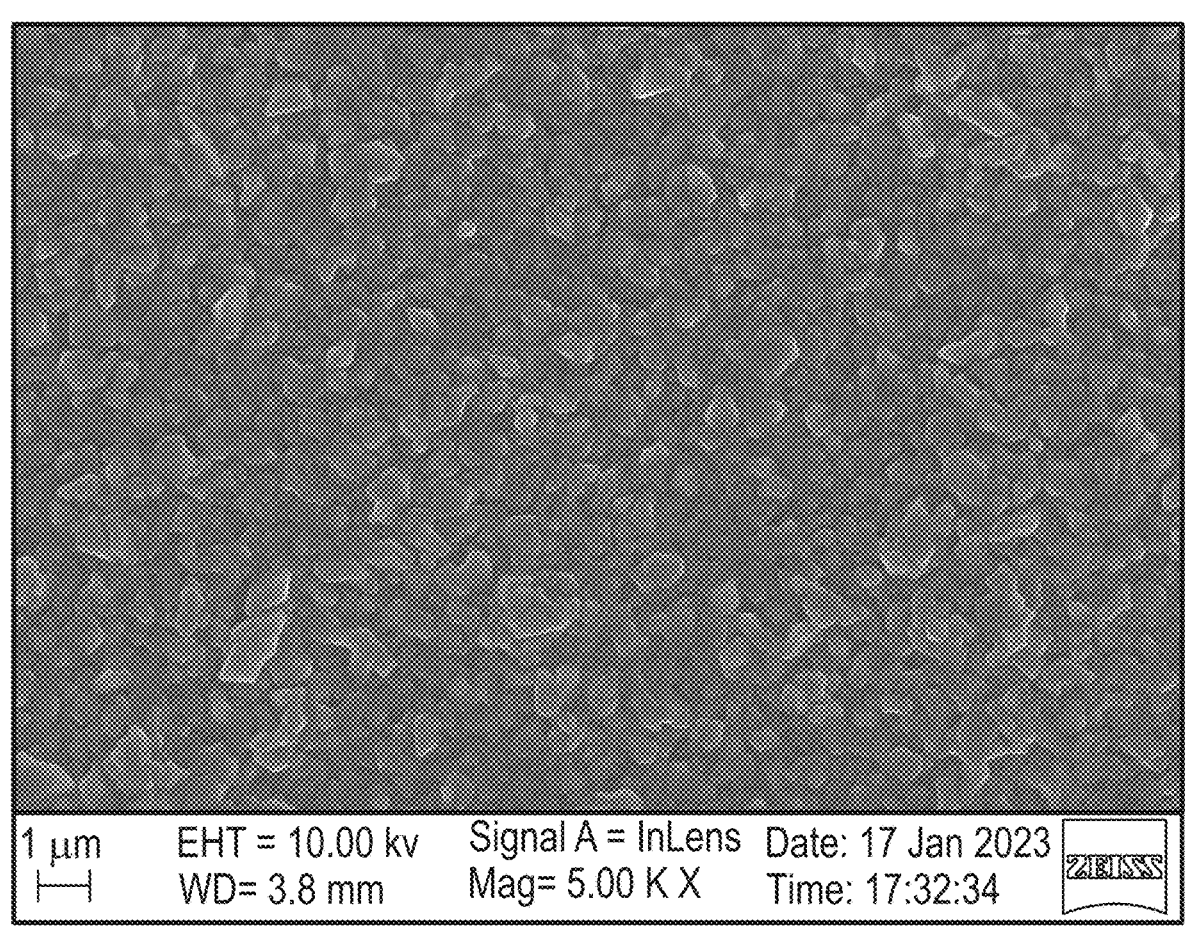
FIGS. 2A and 2B are top-view and cross-sectional scanning electron microscopy (SEM) images of an annealing-free inkjet-printed perovskite absorbent layer fabricated on the top of a mesoporous $TiO_2$ layer using gamma-valerolactone-based ink, in accordance with the principles of this disclosure.
Figure 2B:
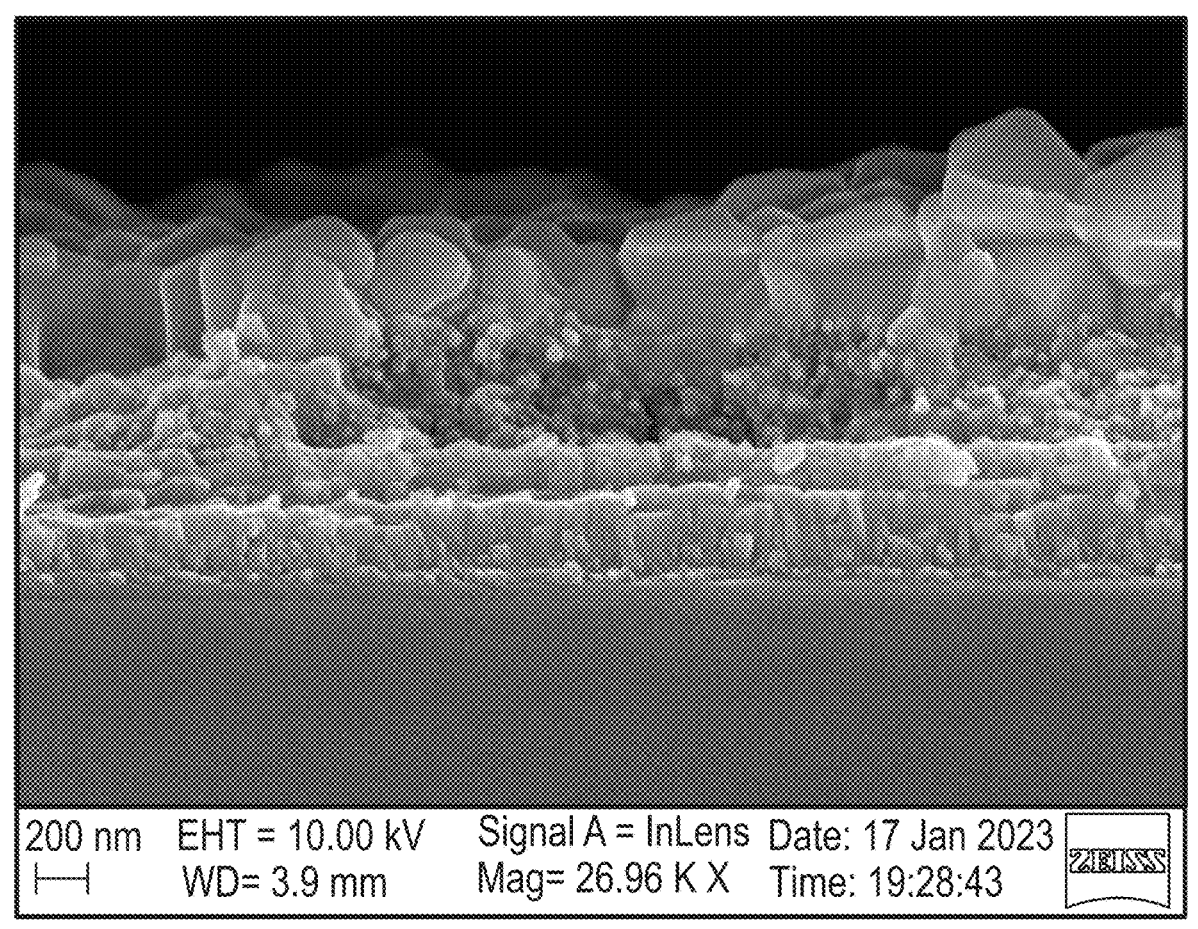

According to an embodiment of the present disclosure, above layer 5, a perovskite precursor ink is inkjet-printed, consisting of the layer 6. The perovskite material of layer 6 is preferable but not limited to be between the chemical formula $Cs_xMA_yFA_{1-x-y}Pb(I_{1-z-t}Br_zCl_t)_3$ of compounds, where MA is the methylammonium, and FA is the formamidinium. Layer 6, which is printed on the top of layer 4 or 5 (depending on the solar cell design), may have a thickness ranging from about 600 to about 800 nm but is not limited to this range. According to the previous formula, perovskite precursors consist of compounds, which preferably are dissolved in solvents such as dimethylformamide (DMF), dimethylsulfoxide (DMSO), gamma-valerolactone (GVL) or 2-Methoxyethanol (EGME), and as a result, many different inks with different combination of solvents and primer materials can be produced. The inkjet printing process can support the formation of layer 6 in one-pass or multi-pass processing on top of layer 4 or 5, while the crystallization of the material can be carried out at a low temperature using only heating from the printer (heating from the print-bed and print-head). To achieve the highest quality of the inkjet-printed perovskite layer, all the printing parameters should be manipulated, such as the temperature of the print-bed and print-head, the printing frequency, the resolution, etc., in order to avoid manufacturing defects, such that coffee-ring defects. A specific example of one perovskite precursor ink for the fabrication of the active layer of the solar cell on the top of the mesoporous layer is the following: 0.8 M of MAI and $PbI_2$ dissolved in GVL. A top-view and cross-sectional scanning electron microscopy image captured from this kind of samples are shown in FIGS. 2A and 2B. The printing parameters employed to print this ink in a Fujifilm Dimatix DMP-2850 printer employing a Dimatix Samba printhead are presented in Table 1.

TABLE 1

| Printing Parameters | Values |
|---|---|
| $T_{substrate}$ (° C.) | 60 |
| $T_{printhead}$ (° C.) | 50 |
| $h_{cartridge}$ (mm) | 0.5 |
| Meniscus vacuum (inches $H_2O$) | 5 |
| Firing voltage (volts) | 20 |
| Overall pulse duration (μs) | 8 |
| Jetting frequency (kHz) | 12 |
| Drop spacing (μm) | 4 × 26 |

According to an embodiment of the present disclosure, above layer 6, a material that can transport positive charge carriers (i.e., "holes") is deposited (optional) via the inkjet printing method. Material 7 is preferable but not limited to inorganic metal oxides, such as NiO, CuO or $Cu_2O$. This layer can be developed using colloids composed of surface-modified (functionalized) nanoparticles dispersed in benign-to-perovskite solvents, such as alcohols. The thickness of layer 7 can vary between about 50 and about 200 nm. A specific example of colloid ink for the fabrication of the HTL, but not limited to, is the following: at first nickel oxide nanoparticles are developed using nickel nitrate hexahydrate dissolved in deionized water under magnetic stirring (130 mg/ml); 10 M NaOH aqueous solution is then added drop-wise into the above-mentioned solution until the pH value has reached 10; the obtained solution is centrifuged and the precipitation is taken and washed with deionized water twice; the powder is dried at about 80° C. overnight, then crystallized at about 300° C. for about 2 hours. The obtained nickel oxide nanoparticles are treated with acetic acid (100 mg of powder is mixed with about 200 µl of ethanol and about 20 µl of acetic acid via calcination under about 80° C. for about 12 hours in a closed vessel, followed by their drying at about 60° C. for about 6 hours); this powder is dispersed into a 2-butanol-based solution (0.5 g/ml) con-taining about 15 µl/ml methylamine 33 wt. absolute ethanol. According to an embodiment of the present disclosure, the metal oxide film is deposited by its inkjet printing using a heated print-bed at 60° C., while the temperature of the print-head is regulated at 30° C. Since the thickness of this layer is usually needed to be low, single or dual pass inkjet-printing is applied, while thermal treatment is included.

According to an embodiment of the present disclosure, the cell is completed by the deposition of a C-based elec-trode. C-based electrode, which is the layer 8, can be developed using printing techniques, such as blade coating with needle scribing, from viscous inks composed of car-bonaceous materials and solvents that demonstrate benign compatibility with the perovskite layer. Layer 8 is developed on top of layer 6 or 7, depending on the employed solar cell architecture. The carbon ink can be a combination of several compounds that are based on carbon, such as graphite, carbon black, graphene, carbon nanotubes and carbon nanowires, but are not limited to them. A specific example of carbon paste, but not limited to, is the following: a mixture of graphite micro-powder and carbon black nano-powder (3:1 weight ratio) is milled vigorously in a mortar to attain homogenization; after that, the binder (mixture of glacial acetic acid and titanium (IV) isopropoxide (1:100 volume ratio)) is added dropwise to the mixture scattered around the carbon powder (300 µl/g of carbon materials); finally, terpineol is used to obtain the slurry (1.7 ml/g of carbon materials). According to an embodiment of the present disclosure, the carbon paste is deposited by its blade-coating using a gap of 50 µm, while the solar stripes are isolated using needle scribing. After the deposition of layer 8, the cell is thermally treated at a temperature ranging between about 70 and about 120° C. for about 20 to about 60 min, depending on the composition of the carbon ink, to attain solvents evaporation and satisfactory conductivity for the operation of the solar cell.

According to an embodiment of the present disclosure, the completion of an individual PSC (FIG. 1) requires the presence of silver contacts 9. The silver contacts are printed, such as dispense-printing, on TCO substrate using commer-cial products in the form of highly conductive silver pastes. Depending on the composition of the silver pastes and the thermal treatment needs, the procedure is applied in a different manufacturing step, such as prior to the deposition of layer 6. A specific example of silver paste used for the fabrication of the contacts of the solar cell devices is the commercial product Ag ASP-SC100-61D5, Asagi. Accord-ing to an embodiment of the present disclosure, this silver paste is dispense-printed onto the TCO substrate, while its calcination is carried out at about 125 and about 550° C. for about 10 and about 60 min, respectively. Each strip of silver contact has a width between 1 to 3 mm but is not limited to that dimension.

Figure 3:
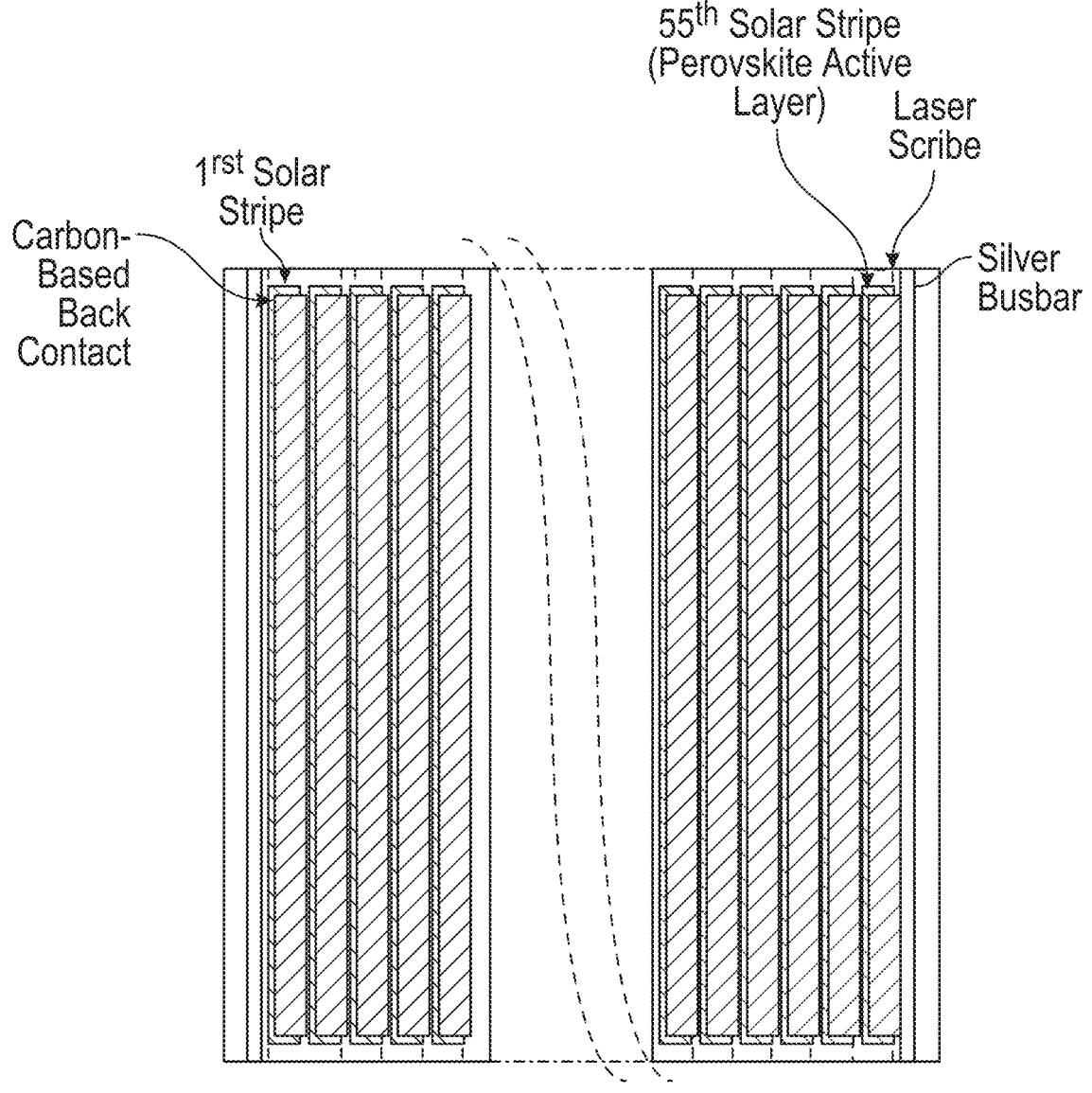
FIG. 3 is a diagram illustrating a top-view of a perovskite solar sub-module of 520 mm×520 mm with 70% active-to-aperture coverage, with solar stripes in series connection, in accordance with the principles of this disclosure.
Figure 4:
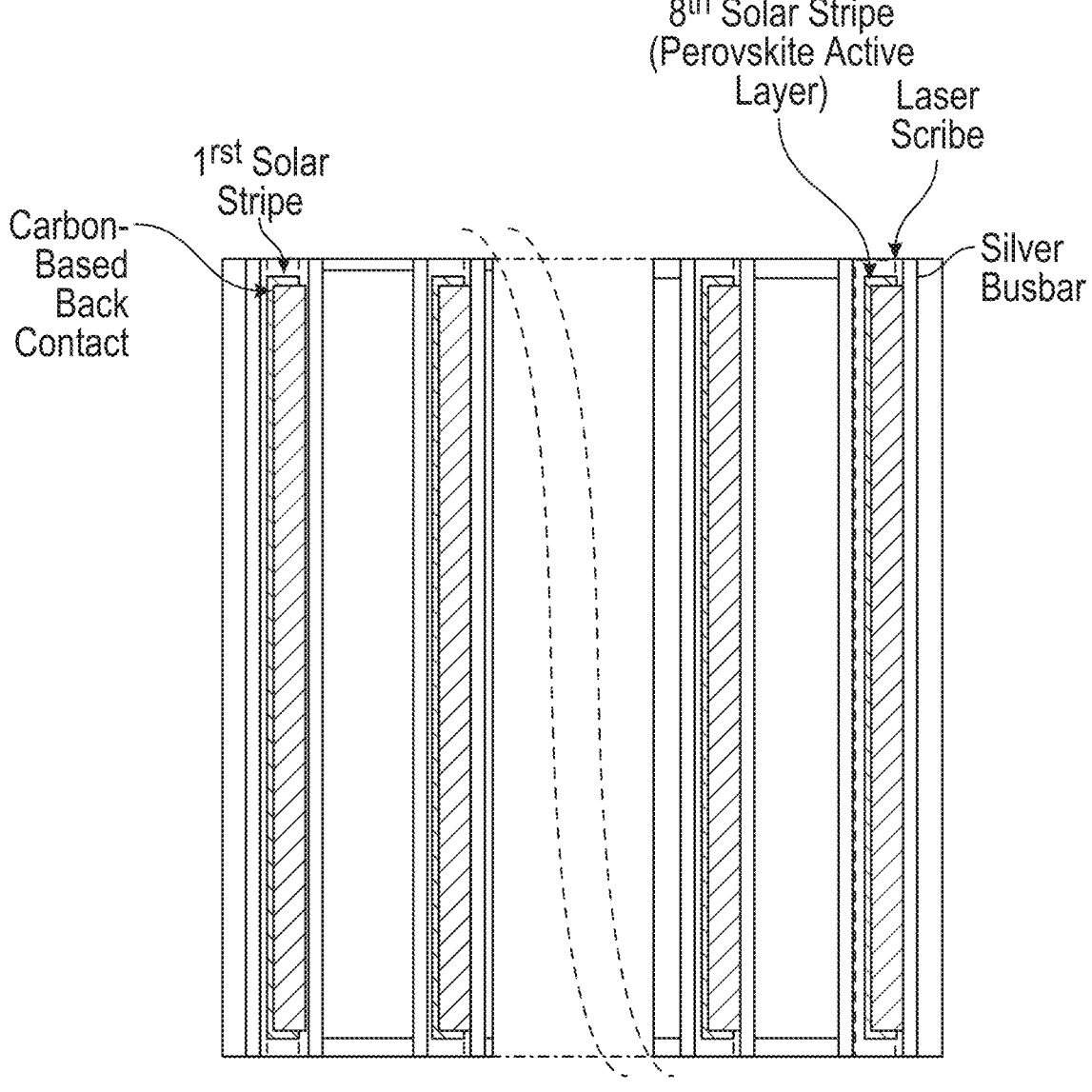
FIG. 4 is a diagram illustrating a top-view of a perovskite solar sub-module of 520 mm×520 mm with 10% active-to-aperture coverage, with solar stripes in series connection, in accordance with the principles of this disclosure.

According to an embodiment of the present disclosure, a perovskite solar sub-module in 520 mm×520 mm indicative dimensions is presented in FIG. 3. The sub-module consists of 55 independent perovskite solar stripes but is not limited to that number. In this case, the solar stripes effective area is about 70% of the aperture area. The perovskite solar stripes are in series connected on the top of the conductive sub-strate. However, an alternative case could be the partial coverage of the conductive substrate by solar stripes, where their effective area is then about 10% of the aperture area. In this case, a more transparent solar sub-module can be prepared as the free space among perovskite solar stripes is enlarged (see FIG. 4). According to the drawings of FIG. 3 and FIG. 4, after the deposition of all the above-mentioned layers, the perovskite solar sub-modules are completed by applying electrical contacts. These contacts are positioned among the two opposite sides of the glass using an ultrasonic soldering station, while at the same time, permanent and durable cable welding is implemented. In a second embodi-ment of the present disclosure, silver contacts may be effectively applied on the opposite sides of the same con-ductive substrate by dispensing a low temperature processed silver ink (compatible with the plastic substrates).

Figure 5:
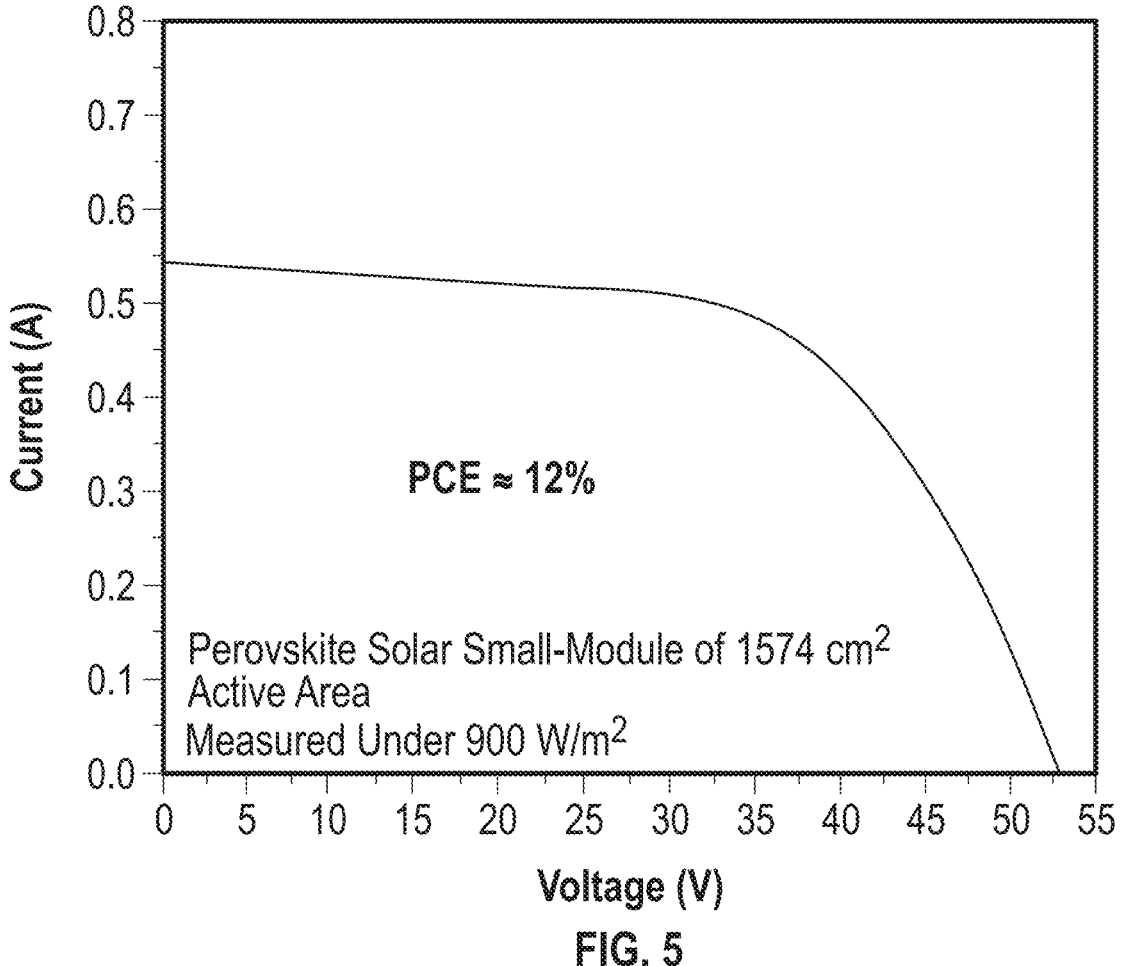
FIG. 5 is a graph illustrating IV curve of a perovskite solar sub-module of 520 mm×520 mm with 70% active-to-aperture coverage, with solar stripes in series connection, measured under 900 $W/m^2$ solar light irradiation, A.M. 1.5, T=25° C. and RH≈50%, in accordance with the principles of this disclosure.

According to an embodiment of the present disclosure, the electrical characterization of a perovskite solar sub-module with high coverage of the glass (70% of aperture area) took place at solar irradiation of about 900 W/m², A.M. 1.5, T=25° C. and 50% RH that is given in FIG. 5. The value of current is the same for any individual strip of the active area, as well as for the whole device since the connection is in series. Carbon as a conductor is reinforced with Ag bus bars of resistance lower than 1 Ohm. Each silver strip has a length of 520 mm but is not limited to that length, and the width is 3 mm but not limited to that dimension. The electrical characteristics of the sub-module are presented in FIG. 5. The value of the overall efficiency of the effective area of the sub-module is about 12%, while it is constructed under full ambient and uncontrolled conditions.

Figure 6:
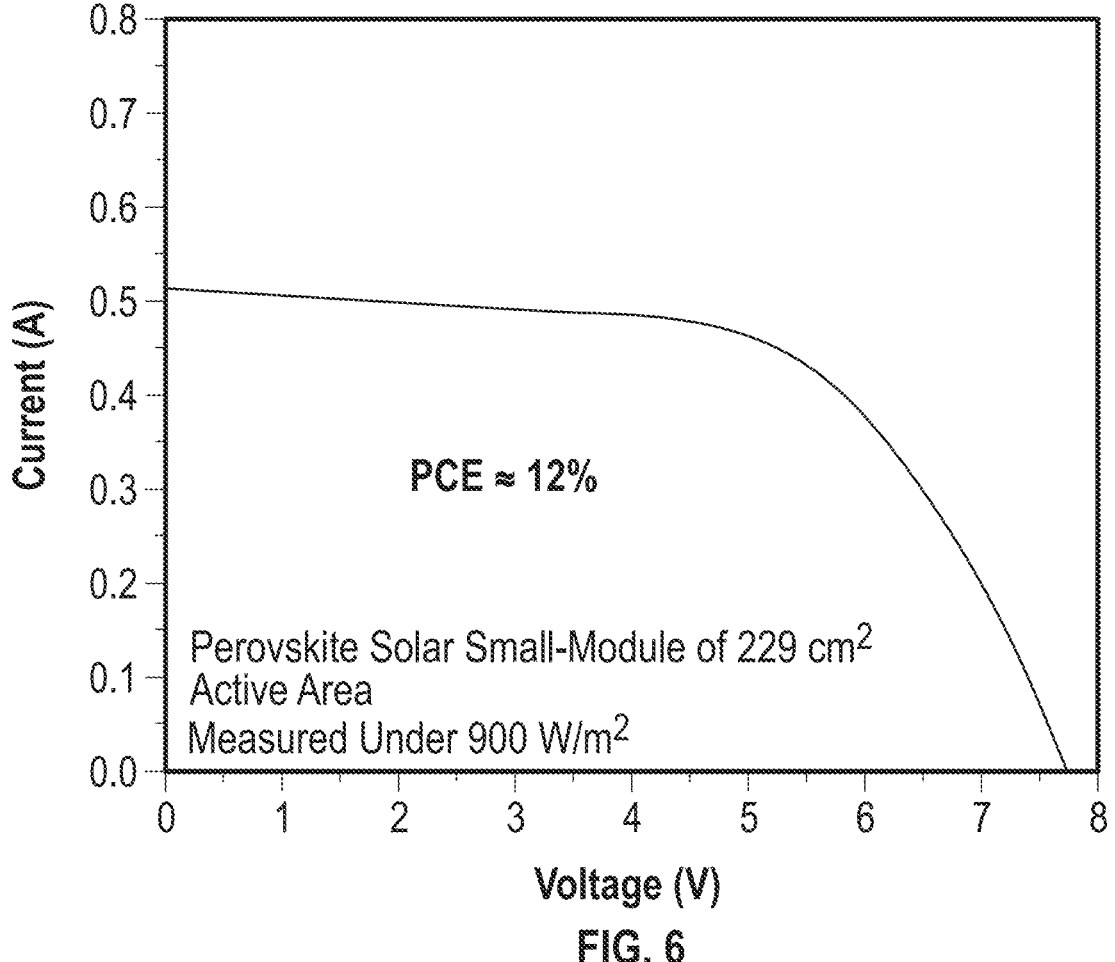
FIG. 6 is a graph illustrating IV curve of a perovskite solar sub-module of 520 mm×520 mm with 10% active-to-aperture coverage, with solar stripes in series connection, measured under 900 $W/m^2$ solar light irradiation, A.M. 1.5, T=25° C. and RH≈50%, in accordance with the principles of this disclosure.

According to another embodiment of the present disclo-sure, the electrical characterization of a perovskite solar sub-module with low coverage of the glass (10% of aperture area) took place under about 900 W/m² solar irradiation, A.M. 1.5, T=25° C. and 50% RH that is given in FIG. 6. The value of current is the same for any individual strip of the active area, as well as for the whole device since the connection is in series. Carbon as a conductor is reinforced with Ag bus bars of resistance lower than about 1 Ohm. Each strip has a length of about 520 mm but is not limited to that length, and the width is about 3 mm but not limited to that dimension. However, around any of the solar cell stripes in that configuration, individual silver bus bars are additionally dispense-printed. The electrical characteristics of the sub-module are presented in FIG. 6. The value of the overall efficiency of the effective area of the sub-module is about 12%, while it is constructed under full ambient and uncon-trolled conditions.

According to an embodiment of the present disclosure, the perovskite solar sub-modules can be consisted of about 10 to 100 individual solar stripes in series interconnected depending on the size of the substrate, which can range between 500 mm×500 mm to 1000 mm×1000 mm area, depending on the manufacturing capability of inkjet printer. The distance between the individual cells can also be varied depending on the needed transparency and power output.

Figure 7:
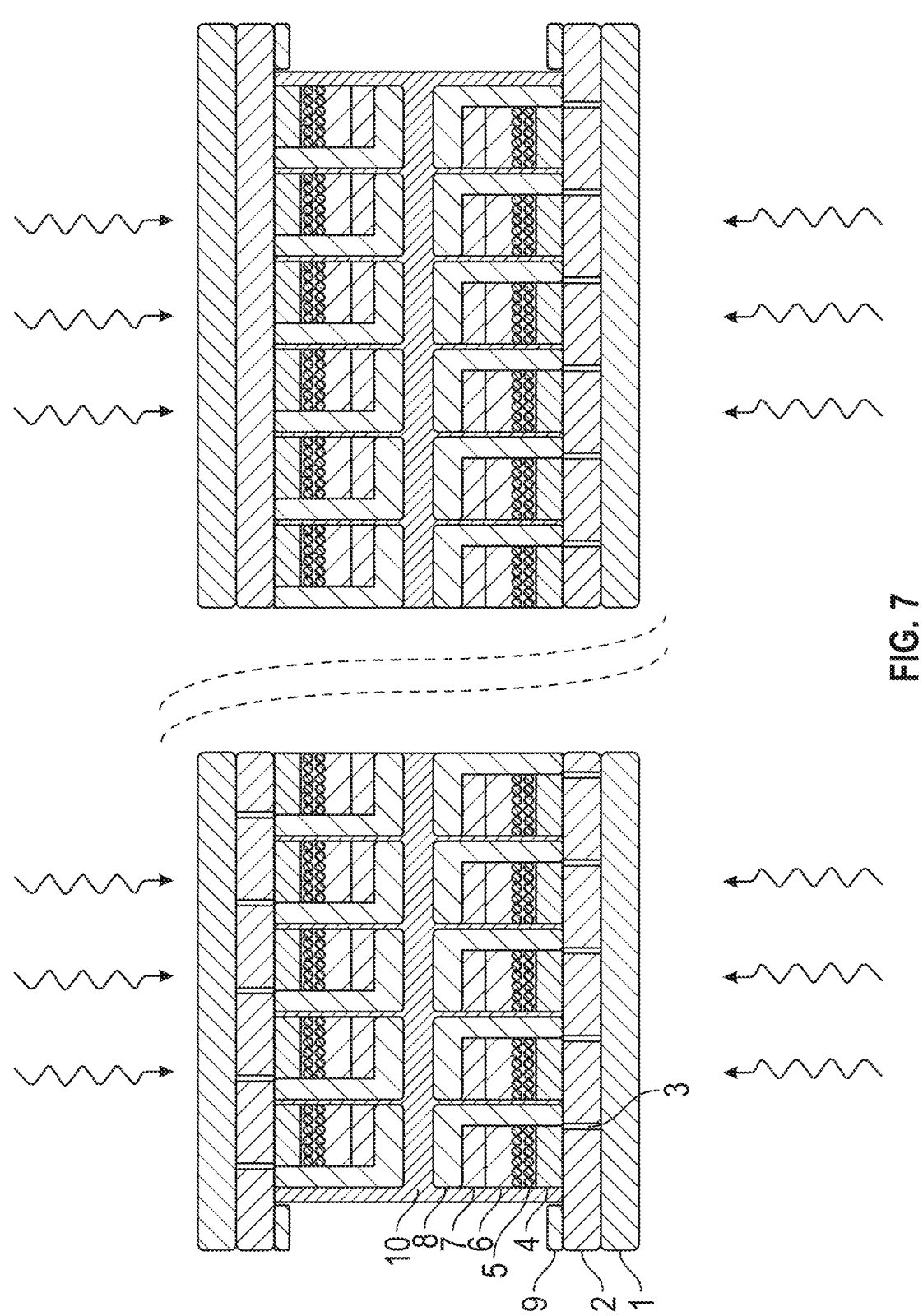
FIG. 7 is a cross-sectional schematic image of a bifacial structure of a carbon-based perovskite solar module in high coverage of the aperture area, in accordance with the principles of this disclosure.

To develop the bifacial C-based perovskite solar module, two solar sub-modules are placed together in a formation where carbon electrodes face one the other, making the structure of a bifacial solar module that utilizes solar light from both sides. The structure of two single perovskite solar sub-modules that face one other appears in FIG. 7, so each one of the solar stripes of the front-face sub-module is exactly aligned with the corresponding solar stripes of the rear-face sub-module. The space among the solar stripes can vary at any of the perovskite solar sub-modules in a way that always the solar stripe of the front-face sub-module is exactly aligned with the corresponding solar stripe of the rear-face sub-module. The isolation of the two perovskite solar sub-modules that constitute the bifacial solar module according to an embodiment of the present disclosure is achieved by the use of material 10. Material 10 can be but not limited to a thermoplastic membrane, such as ethylene-vinyl acetate (EVA). According to an embodiment of the present disclosure, the encapsulation of the bifacial perovskite solar module is carried out in a lamination workstation under a pressure of 8 bar for an aperture area of 2500 cm$^2$, under about 60° C. for about 15 min, and about 130° C. for about 45 min thermal treatment. In a second embodiment, the thermoplastic sealant can be substituted by a thermoset polymer dispensed in height ranging from about 1 mm to about 3 mm but not limited to that range. The sealant is applied from one edge of the substrate to the other of the rear-face sub-module in order to achieve isolation between the sub-modules that constitute the bifacial PV. Then, the two sub-modules are put together in a manner that carbon electrodes face one to the other, as appears in FIG. 7.

According to an embodiment of the present disclosure, device architecture engineering is applied to obtain high-performance sub-modules for either direct sunlight or diffuse light conditions. With the focus on ETL, a mesoporous design is applied for perovskite solar sub-modules that are intended to operate under high-intensity sunlight (e.g., front-face sub-module of bifacial PV) and a planar design for the corresponding devices that are intended to operate under low-intensity diffuse sunlight or indoor light (e.g., rear-face sub-module of bifacial PV).

According to an embodiment of the present disclosure, bandgap engineering of the perovskite active layer is applied to enhance the performance of perovskite solar sub-modules under low-light and indoor-light conditions. To this purpose, wider bandgap perovskite structures are developed to capture the light from rear-face perovskite solar sub-modules, wherein part of I-ions of the Cs$_x$MA$_y$FA$_{1-x-y}$Pb(I$_{1-z-t}$Br$_z$Cl$_t$)$_3$ structures are replaced by Br ions, increasing the bandgap of the material. A specific example of a group of perovskite structures that are developed to be employed as an active layer of rear-face perovskite solar sub-modules is the Cs$_x$MA$_y$FA$_{1-x-y}$Pb(I$_{0.85}$Br$_{0.15}$)$_3$, replacing the Cs$_x$MA$_y$FA$_{1-x-y}$PbI$_3$.

According to an embodiment of the present disclosure, a C-based HTL-free perovskite solar sub-module architecture is applied for the front-face sub-module to attain high-efficiency and stability, while an HTL is applied in the architecture of the rear-face sub-module to increase the main PV characteristics, such as the photo-voltage and fill factor, increasing thus bifaciality.

Figure 8:
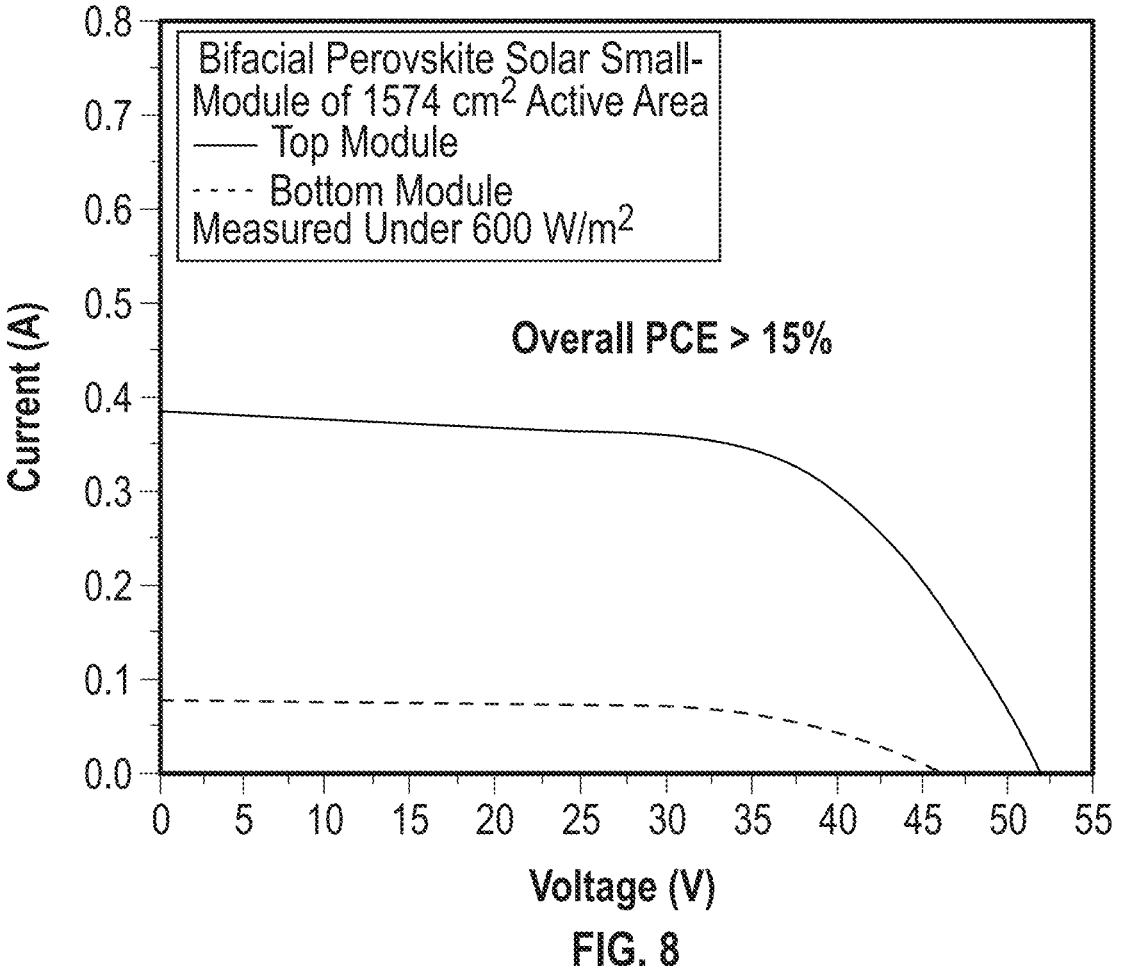
FIG. 8 is a graph illustrating IV curves for a bifacial perovskite solar module of 520 mm×520 mm with 70% active-to-aperture coverage, measured under 600 $W/m^2$ solar light irradiation, A.M. 1.5, T=25° C. and RH=50%, in accordance with the principles of this disclosure.

According to an embodiment of the present disclosure, the electrical characterization of a bifacial perovskite solar module with about 70% active-to-aperture area took place under 600 W/m$^2$ solar irradiation, as appears in FIG. 8. The bifacial perovskite solar module was composed of two identical sub-modules. The device was ground mounted, almost 1 m above a regular cement surface. The overall efficiency of the module was found to be higher than 15%, giving an about 26% increase in the power output of the device when compared to the corresponding monofacial counterpart operated under the same environmental conditions (light intensity and temperature). This number of PCE increase is considered quite high considering that the installation of the PV device was not optimized for giving an increased bifaciality factor, while the results can be even better when a rear-face sub-module is specially designed for giving high performance under diffuse/low light conditions.

Persons skilled in the art will understand that the structures and methods specifically described herein and illustrated in the accompanying figures are non-limiting exemplary aspects, and that the description, disclosure, and figures should be construed merely as exemplary of particular aspects. It is to be understood, therefore, that this disclosure is not limited to the precise aspects described, and that various other changes and modifications may be effectuated by one skilled in the art without departing from the scope or spirit of the disclosure. Additionally, it is envisioned that the elements and features illustrated or described in connection with one exemplary aspect may be combined with the elements and features of another without departing from the scope of this disclosure, and that such modifications and variations are also intended to be included within the scope of this disclosure. Indeed, any combination of any of the disclosed elements and features is within the scope of this disclosure. Accordingly, the subject matter of this disclosure is not to be limited by what has been particularly shown and described.

What is claimed is:

1. A method of manufacturing a bifacial carbon-based perovskite photovoltaic module, comprising:
   combining two inkjet-printed carbon-based perovskite solar sub-modules,
       wherein each sub-module includes:
           a plurality of solar stripes, each of the solar stripes comprising:
           a surface conductive substrate;
           an electron-transport-layer comprised of at least one of: a titanium oxide or a tin oxide-titanium oxide combination;
           a perovskite active layer; and
           an opaque carbon electrode,
       wherein the two sub-modules comprise a front sub-module and a rear sub-module arranged in a configuration where the carbon electrodes of each face one another, and
       wherein the front sub-module is configured without a hole-transport-layer and the rear sub-module includes a hole-transport-layer; and
   applying an encapsulant on a rear-face of each sub-module to assemble a single device using heating and pressure under vacuum.

2. The method according to claim 1, wherein a design of the electron transport layer of each sub-module is selected between mesoporous or planar when developing sub-modules for direct sunlight or diffuse/reflected and indoor light operation, respectively.

3. The method according to claim 1, wherein the active layer of the sub-module developed for direct sunlight operation comprises perovskite structures configured for diffuse/reflected and indoor light operation,
   wherein the active layer comprises wider bandgap perovskite structures achieved by partial substitution of I— ions with Br— ions.

4. The method according to claim 1, wherein the surface conductive substrate of each sub-module comprises at least one of transparent conductive oxide coated glass or transparent conductive oxide coated plastic.

5. The method according to claim 1, wherein the electron-transport-layer of each sub-module comprises inkjet-printing a colloid or solution ink that contains at least one metal oxide material.

6. The method according to claim 1, wherein the active layer of each sub-module comprises inkjet-printed metal halide perovskite structures that do not need extra annealing processing after their printing.

7. The method according to claim 1, wherein the active layer of each sub-module comprises inkjet-printing 0.8M perovskite precursor inks.

8. The method according to claim 1, wherein each of the solar stripes of the rear sub-module includes the hole-transport-layer, and wherein the hole-transport-layer is comprised of an inkjet-printed colloid ink that contains at least one metal oxide material.

9. The method according to claim 1, wherein the carbon electrode of each sub-module is comprised of a blade coated or a screen printed paste containing at least one of a graphite micro-powder or a carbon black nano-powder.

* * * * *